US012782404B2

(12) United States Patent
Morstabilini et al.

(10) Patent No.: US 12,782,404 B2
(45) Date of Patent: Nov. 3, 2026

(54) METHOD AND DEVICE FOR MEASURING AN EARTH RESISTANCE IN A BATTERY CHARGING STATION

(71) Applicants: ELDOR CORPORATION S.P.A., Orsenigo (IT); DR. ING. H.C. F. PORSCHE AG, Stuttgart (DE)

(72) Inventors: Raul Morstabilini, Orsenigo (IT); Alessandro Poli, Orsenigo (IT); Pasquale Forte, Orsenigo (IT); Claudio Piccoli, Orsenigo (IT)

(73) Assignees: BORGWARNER ORSENIGO S.R.L., Orsenigo (IT); DR. ING. H.C. F. PORSCHE AG, Stuttgart (DE)

( * ) Notice: Subject to any disclaimer, the term of this patent is extended or adjusted under 35 U.S.C. 154(b) by 110 days.

(21) Appl. No.: 18/258,608

(22) PCT Filed: Dec. 17, 2021

(86) PCT No.: PCT/IB2021/061923
§ 371 (c)(1),
(2) Date: Jun. 21, 2023

(87) PCT Pub. No.: WO2022/137054
PCT Pub. Date: Jun. 30, 2022

(65) Prior Publication Data

US 2024/0044960 A1 Feb. 8, 2024

(30) Foreign Application Priority Data

Dec. 21, 2020 (IT) ........................ 102020000031625

(51) Int. Cl.
*G01R 27/20* (2006.01)
*H02H 7/18* (2006.01)

(52) U.S. Cl.
CPC ............... *G01R 27/20* (2013.01); *H02H 7/18* (2013.01)

(58) Field of Classification Search
CPC .................................. G01R 27/20; H02H 7/18
See application file for complete search history.

(56) References Cited

U.S. PATENT DOCUMENTS 8,405,940 B2 * 3/2013 Schweitzer, III ........ H02H 7/06 361/42
11,498,442 B2 * 11/2022 Engel .................... B60L 3/0069
(Continued)

FOREIGN PATENT DOCUMENTS

CN 206725655 U 12/2017
CN 110308332 A 10/2019
EP 0278147 A1 8/1988

OTHER PUBLICATIONS

International Search Report and Written Opinion dated Mar. 22, 2022 from counterpart International Patent Application No. PCT/IB2021/061923.

*Primary Examiner* — Crystal L Hammond
*Assistant Examiner* — Samantha L Faubert
(74) *Attorney, Agent, or Firm* — SHUTTLEWORTH & INGERSOLL, PLC; Timothy J. Klima

(57) ABSTRACT

A method for measuring an earth resistance in a battery charging system, including the steps of injecting a measuring signal in alternating current between a first, neutral node and a second, earth node, detecting a voltage signal representing an electrical potential difference between the first and the second node, processing the voltage signal so as to extract a first signal having a frequency equal to that of the measuring signal and a phase correlated thereto, and calculating an earth resistance value as a function of a ratio between the measuring signal and a reference value of said first signal.

16 Claims, 1 Drawing Sheet

(56) References Cited

U.S. PATENT DOCUMENTS

Figure 1:
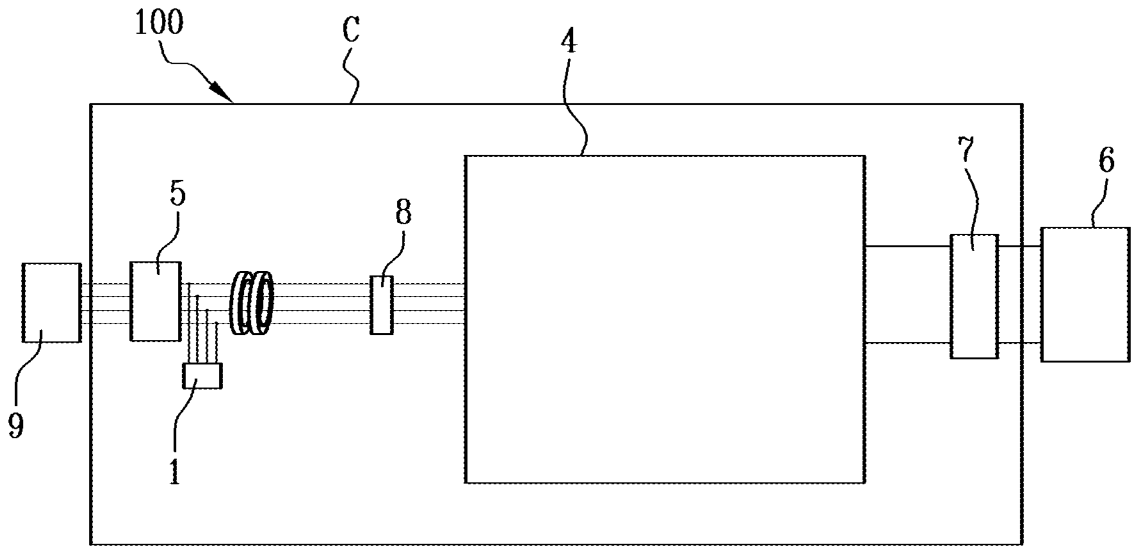

2009/0040666 A1* 2/2009 Elms .................... H02H 3/334
361/93.6
2014/0176163 A1 6/2014 Ripoll et al.
2015/0077055 A1 3/2015 Merienne
2017/0026211 A1* 1/2017 Gerdes ................ H04L 27/122
2017/0110869 A1* 4/2017 Bargues ............... H02H 1/003

* cited by examiner

METHOD AND DEVICE FOR MEASURING AN EARTH RESISTANCE IN A BATTERY CHARGING STATION

This application is the National Phase of International Application PCT/IB2021/061923 filed Dec. 17, 2021 which designated the U.S.

This application claims priority to Italian Patent Application No. 102020000031625 filed Dec. 21, 2020, which applications are incorporated by reference herein.

The present invention relates to a method and a device for measuring an earth resistance in a battery charging system, preferably traction (automotive) batteries.

Therefore, the present invention finds its main application in the automotive field, in particular in the design and construction of charging systems for electric batteries.

In the field of electric vehicles, in fact, the battery pack charging mode is divided into two distinct respective macro-categories: on-board chargers and ground chargers.

The "on-board chargers", as the name suggests, are built into the vehicle and include all the power and control electronics needed to convert the alternating current from the grid into direct current required to recharge the battery pack.

On the other hand, the "ground" chargers are the usual "columns" or wallboxes which operate the conversion directly by supplying direct current to the vehicle.

It therefore appears that battery chargers of both categories, since they have to manage an alternating current coming from the grid and convert it into direct current for recharging high-voltage batteries, show significant problems from the user's safety point of view, and must be equipped with suitable protection systems.

This is even more crucial in the construction of non-insulated on-board charging systems, in which the battery charger has a direct (and non-inductive) electrical connection with alternating current wiring.

One of the main research areas relating to safety systems is that of checking whether the vehicle or the column is correctly "connected to earth", which in some cases is carried out by injecting a current signal into the grid, measuring the resulting voltage through appropriate computational calculations, and calculating the respective earth resistance.

Disadvantageously, however, this method is not free of drawbacks, since its effectiveness is closely linked to the boundary conditions, i.e., the noise grid conditions.

Considering that the distribution system has numerous users connected to the same substation with the most varied applications, it is not uncommon for the frequency used in the generation of the current signal to be already occupied by very significant disturbances.

In several cases, given the strict regulatory constraints limiting the current intensity that can be used for measurement to just over 1 mA, this involves a practical difficulty in determining which component of the detected voltage signal is to be correlated with the injected signal and which is instead the noise component.

Therefore, it is an object of the present invention to provide a method and a device for measuring an earth resistance in a battery charging system, which can overcome the above-mentioned drawbacks of the prior art.

In particular, it is an object of the present invention to provide a method and a device for measuring an earth resistance in a battery charging system, which are highly reliable and versatile, so they can adapt, without losing efficiency, to distribution systems with varying noise levels.

Said objects are achieved by means of a method and a device for measuring an earth resistance in a battery charging system having the features of one or more of the ensuing claims.

In particular, the method comprises injecting (or generating) a measuring signal in alternating current between a first, neutral node of the grid and a second, earth node.

Preferably, the measuring signal has a pre-set frequency and a pre-set duration.

A voltage signal representing the electrical potential difference between said first and said second node is therefore detected.

According to the invention, the voltage signal is therefore processed so as to extract a first signal having a frequency equal to said pre-set frequency and a phase correlated to that of said measuring signal.

It should be noted that the term "phase correlated to" is intended to define that the first signal has a phase shift which is null or constant over time with respect to said measuring signal.

In other words, by knowing the measuring signal, or its frequency, it is possible to determine which frequency the voltage signal to be detected should have, which, unlike any noisy components at the same frequency, being closely related to the measuring signal, will have to maintain relative thereto the same phase shift over time, thus allowing the extraction thereof.

At this point, once the voltage signal is known, it is possible to calculate an earth resistance value as a function of a ratio between a value identifying the measuring signal and a reference value of said first signal.

Clearly, since the distribution system is in alternating current, the resistance must be calculated considering also equivalent impedances and capacitances of the circuit.

According to a further aspect of the invention, however, the measuring method described so far can be used as a basis for a method of protecting the battery charging system, which is also an (independent) object of the present invention.

The protection method in fact involves using the measured/calculated earth resistance value as a basis for comparing it with a reference limit value, then insulating the converter assembly of the battery charger from the grid if said earth resistance value exceeds said reference limit value.

Preferably, the reference limit value is set to be less than 300 ohms, more preferably approximately 200 ohms.

A further object of the present invention is a device for measuring the earth resistance in a battery charging system, provided with a processing unit configured to implement the method described heretofore.

The dependent claims, hereby incorporated by reference, correspond to different embodiments of the invention.

Figure 2:
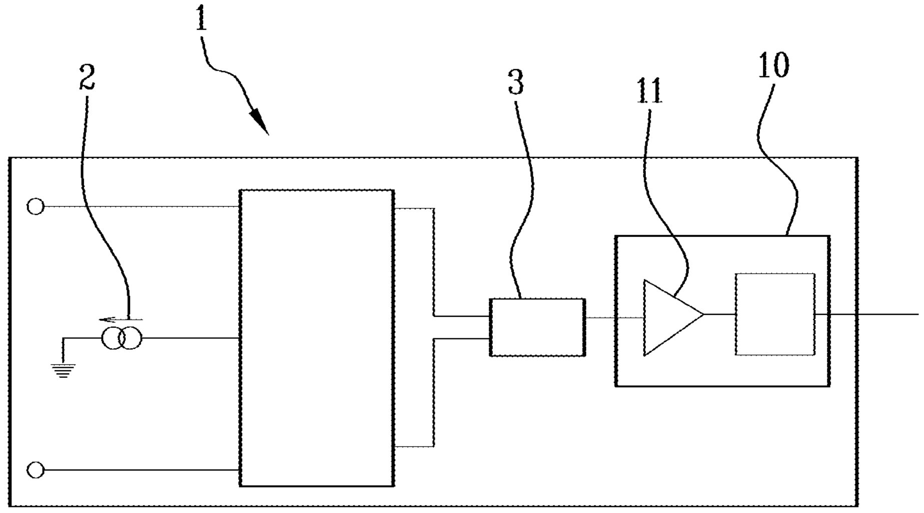

Further features and advantages of the present invention will become more apparent from the indicative, and therefore non-limiting description of a preferred, but not exclusive, embodiment of a method and a device for measuring an earth resistance in a battery charging system, as illustrated in the accompanying drawings, wherein:

FIG. 1 schematically shows the structure of an on-board charging device provided with a protection device according to the present invention;

FIG. 2 schematically shows the structure of a device for measuring an earth resistance in accordance with the present invention.

With reference to the accompanying figures, reference numeral 1 generally designates a device for measuring an earth resistance in a battery charging system according to the present invention.

The following will describe a device 1 for measuring an earth resistance inside an on-board charging device 100 purely by way of example; in fact, this description is not intended to limit the application and scope of the invention.

A similar description could be provided for ground charging systems, such as columns or wall-boxes, but since measuring the earth resistance is more critical in vehicles, in the following preference was given to provide a description of the application from which the invention finds greater advantages.

The term on-board charging device 100 herein is intended to generally define any charging system for a traction battery pack 6 able to connect to the AC grid, converting it into direct current before powering the battery.

For this reason, the charging device 100 comprises at least one casing C (connected to earth) associated with a connection socket 9 for connection to the grid G and containing a converter assembly 4 configured to convert the alternating current coming from the grid G into a direct current that can be used for recharging the battery pack 6.

The connection socket 9 is therefore configured to receive both the three phases L1, L2, L3 and the neutral N.

Preferably, the charging device 100 further comprises at least one electromagnetic disturbance filtering element arranged along a current input line, i.e., between the connection socket 9 and the converter assembly 4.

More preferably, the electromagnetic disturbance filtering elements are two, a first one 5 along the (alternating) current input line and a second one 7 along a (direct) current output line, i.e., between the converter assembly 4 and the battery pack 6.

In the preferred embodiment, the charging device 100 is of the non-insulated type, i.e., it provides a physical (i.e., non-inductive) connection between the battery and the distribution system.

Preferably, in this type of device 100 the converter assembly 4 comprises at least one boost module and at least one buck module.

In the preferred embodiment, the converter assembly 4 comprises:

- a first conversion stage (or AC-DC converter) configured to convert the alternating current coming from the grid G into direct current;
- a charging stage, preferably defined by a capacitor bank, operatively arranged downstream of the first conversion stage and configured to be charged by receiving its output;
- a second conversion stage (or DC-DC converter) configured to modulate the level of direct current sent to the battery pack 6.

In the preferred embodiment, as stated, the charging device 100 is of the non-insulated type, therefore the second conversion stage is connected directly to the battery pack (i.e., without the conversion/inductive stage).

According to one aspect of the invention, an earth resistance is associated with the charging device 100, as a separate object of the present invention.

The measuring device 1 is configured to detect any earthing problems by measuring said resistance.

This measuring device 1 comprises a current generator 2 with variable amplitude and frequency (and possibly phase) configured to generate and inject a measuring signal in alternating current into the grid G between a first, neutral node N and a second, earth node PE.

There is also provided a voltage detection module 3 configured to detect a voltage signal representing the potential difference between the first N and the second node PE.

In particular, the detection module 3 is preferably configured to detect the voltage signal following the injection or generation of the measuring signal by the current generator 2.

Moreover, this detection module 3 is preferably of the variable-gain kind and is configured to vary the gain and therefore an identifying value (e.g., the amplitude) of the voltage signal as a function of the noise level thereof.

In the preferred embodiment, the detection module 3 comprises a peak rectifier, preferably of the double half-wave kind, configured to generate a rectified signal representing the module of said voltage signal.

Said measuring device 1 comprising a configured processing unit 10 is also configured to identify a peak value of said rectified signal within a predetermined time interval.

Said processing unit 10 being further configured to amplify or attenuate said identifying value (e.g., the amplitude) of the measuring signal as a function of said peak value.

More preferably, the processing unit 10 is thus configured to reduce said identifying value (e.g., the amplitude) as the peak value increases, and vice versa.

The measuring device 1 further comprises an amplifier module 11 associated with said detection module 3 and with said current generator 2.

Said amplifier module 11 being configured to process said voltage signal on the basis of said measuring signal so as to extract a first signal having a frequency corresponding to said measuring signal and a phase correlated thereto.

It should be noted that the term "phase correlated to" is intended to define that the first signal has a phase shift which is null or constant over time with respect to said measuring signal.

In the preferred embodiment, the amplifier module 11 is a lock-in amplifier (or phase-sensitive detector), which can be made entirely of hardware components or, preferably, with at least part of the architecture defined by software feature.

This lock-in amplifier comprises a multiplier (a reference signal and the noisy signal) followed by a low-pass integrating filter with an integration period longer than the period of the signal to be extracted.

Since the sinusoidal functions are orthogonal, the result of this operation is null if:

- the extracted signal and the carrier have different frequencies
- they have the same frequency and are 90° out of phase.

Instead, the result has a value other than zero and constant if they are isofrequential or out of phase by a certain constant angle.

On the contrary, if the signals have isofrequential components but with a continuously variable phase, the result is also continuously variable. Therefore, this makes it possible to discriminate whether at a given frequency a noisy component (having a continuously variable phase) or a component associated with the measuring signal (having, as said, a phase correlated to, equal to or phase shifted in a constant manner over time with respect to the measuring signal) is detected.

Alternatively, the amplifier module 11 could comprise a phase locked loop, again provided with a multiplier and a filter, but followed by a controlled oscillator.

In this regard, it should be noted that the processing unit 10 of the measuring device 1 is also configured to calculate an earth resistance value as a function of a ratio between the value identifying the measuring signal and a reference value of said first signal.

Preferably, the processing unit 10 of the measuring device 1 is configured to calculate an earth resistance value as a function of a ratio between a value identifying a parameter representative of the measuring signal and a reference value of the same parameter of the first signal.

In one embodiment, the representative parameter is defined by the amplitude of the signal; alternatively, it could be the value of the time domain signal or still another parameter.

More preferably, the processing unit is configured to convert the first signal into the frequency domain, identifying in the frequency spectrum the one corresponding to the pre-set frequency of the measuring signal and determining that said reference value corresponds to the value of the voltage signal at the pre-set frequency.

In other words, therefore, the processing unit 10 is configured to implement a method for measuring the earth resistance, which is also an (independent) object of the invention.

Therefore, the method comprises injecting (or generating) a measuring signal in alternating current between a first, neutral node N and a second, earth node PE.

The measuring signal is generated by the current generator 2 of the measuring device 1 and injected between the two nodes described above.

It should be noted that the second neutral node PE can be, alternatively:

- a physical grid node (i.e., a node directly connected to the neutral of the connection socket 9);
- a reconstructed virtual node with a potential corresponding to the earth potential and in electrical continuity with the first neutral node N and the phases.

Moreover, a grid noise analysis is preferably performed prior to the generation or injection of the phase measuring signal.

This grid noise analysis step involves detecting a voltage signal representing the grid voltage and identifying a free frequency range wherein said voltage signal has a minimum or zero value (for example, a minimum or zero amplitude).

Preferably, therefore, the pre-set frequency of the measuring signal is within the free range, so as to maximize the reduction of the disturbances during the execution of the measurement.

Preferably, moreover, the measuring signal has a limit average value within a reference time interval.

In other words, the current regulations provide for the metal parts, which must not be touched during ordinary service, to have a contact voltage which must not give rise, through the person's body, to currents not exceeding a limit value for each current cycle, usually considered to be 3.5 mA RMS every 20 msec or 16.6 msec depending on the grid frequency. Considering that a part of this limit value is necessary for the operation of some electronic components, what remains available for the generation of the measuring signal is only the difference between the limit value and the part used.

Therefore, in the preferred embodiment, the limit average value within the single current cycle for the measuring signal can be quantified as approximately 1 mA RMS.

Preferably, the limit average value is therefore a limit average amplitude.

In order to make the injected signal more identifiable than the grid noise, which is usually very high due to the numerous loads connected to a single grid substation, the measuring signal injection step preferably involves modulating the identifying value and the predetermined time interval so that the identifying value has the maximum value compatible with said limit average value.

In other words, if the need arises to amplify the identifying value in order to make the signal more visible, the method comprises the (optional) possibility of reducing the time interval to fractions of the current cycle of the grid, so as to keep the average value lower than the limit value.

Preferably, the method then comprises detecting a voltage signal representing a potential difference between said first N and said second node PE.

This voltage signal is then processed so as to extract a first signal that has a frequency equal to said pre-set frequency and a phase correlated to that of said measuring signal.

It should be noted that the term "phase correlated to" is intended to define that the first signal has a phase shift which is null or constant over time with respect to said measuring signal.

Advantageously, therefore, by knowing the measuring signal, it is possible to determine which frequency the voltage signal to be detected should have, which, unlike any noisy components at the same frequency, being closely related to the measuring signal, will have to maintain relative thereto the same phase shift over time, thus allowing the extraction thereof.

In the preferred embodiment, this extraction step is carried out by means of an amplification and filtration procedure similar to that used in lock-in amplifiers.

More precisely, this voltage signal processing step involves:

- multiplying the voltage signal and a reference signal so as to obtain a resulting signal containing a first frequency content equal to the sum of the frequency of the voltage signal and that of the reference signal and a second frequency content equal to the difference between the frequency of the voltage signal and that of the reference signal;
- filtering the resulting signal obtained so as to only extract the first or second content of said resulting signal.

Advantageously, in this way, it is possible to identify within a highly noisy environment the sole voltage component determined by the injection of the measuring signal, thus allowing the measurement of the earth resistance.

This earth resistance is in fact calculated as a function of a ratio between the value identifying the measuring signal and the reference value of the first signal.

As already mentioned above, said reference value is defined by the voltage signal value at the pre-set frequency of the measuring signal (assessed in the frequency domain); preferably, as mentioned above, the reference value corresponds to a voltage signal amplitude at the pre-set frequency of the measuring signal.

Advantageously, moreover, this method and the device for measuring the earth resistance can be used within methods and devices for protecting the charging device, which are also an (independent) object of the present invention.

In fact, by following the measuring method described heretofore, it is possible to compare the earth resistance value with a reference limit value (preferably less than 300 ohms) and insulate the converter assembly 4 of the charging device 1 from the grid G if said earth resistance value exceeds said reference limit value.

Structurally, to do this, the charging device 1 is equipped with a switch assembly 8 assembled to the measuring device 1 and which can be selectively switched between a closed condition, wherein it electrically connects the socket 9 to the converter assembly 4, and an open condition, wherein it opens the connections, electrically releasing the socket 9 (and therefore the grid G) from the converter assembly 4 (therefore from the battery pack 6).

The invention achieves the intended objects and offers important advantages.

In fact, by appropriately processing (preferably by means of an amplifier) the "noisy" voltage signal, the sole relevant information can be selectively extracted regardless of the grid noise level.

In other words, this solution guarantees the possibility of detecting the earth resistance and increasing the safety of the system for any type of grid and noise condition.

The invention claimed is:

1. A method for measuring an earth resistance in a battery charging system connected or connectable to a grid and provided with a converter assembly configured to convert alternating current from the grid into a direct current usable to charge a battery pack; said method comprising the steps of:

detecting a first voltage signal representing a grid voltage;

identifying a free frequency range, wherein said free frequency range is a range of frequency values to which correspond a minimum or zero value of said first voltage signal;

injecting a measuring signal in alternating current between a first, neutral node and a second, earth node; said measuring signal having a pre-set duration and a pre-set frequency within said free frequency range;

detecting a second voltage signal representing an electrical potential difference between said first, neutral node and said second, earth node;

processing said second voltage signal to extract a first signal having a frequency equal to said pre-set frequency and a phase correlated to a phase of said measuring signal;

calculating an earth resistance value as a function of a ratio between a value identifying the measuring signal and a corresponding reference value of said first signal.

2. The method according to claim 1 comprising the steps of:

transforming said first signal into a frequency domain;

identifying said reference value at a frequency value equal to said pre-set frequency.

3. A method for protecting a battery charging system comprising the following steps:

measuring an earth resistance in a charging device by implementing the method according to claim 2;

comparing said earth resistance value with a reference limit value of the earth resistance;

insulating the converter assembly of the charging device from the grid if said earth resistance value exceeds said reference limit value of the earth resistance.

4. The method according to claim 1, wherein said phase of the first signal is equal to or differs in a constant manner over time from the phase of said measuring signal.

5. A method for protecting a battery charging system comprising the following steps:

measuring an earth resistance in a charging device by implementing the method according to claim 4;

comparing said earth resistance value with a reference limit value of the earth resistance;

insulating the converter assembly of the charging device from the grid if said earth resistance value exceeds said reference limit value of the earth resistance.

6. The method according to claim 1, wherein said processing step involves:

multiplying the second voltage signal and a reference signal to obtain a resulting signal containing a first frequency content equal to a sum of a frequency of the second voltage signal and that of the reference signal and a second frequency content equal to a difference between the frequency of the second voltage signal and that of the reference signal;

filtering the resulting signal obtained to only extract the first frequency content or the second frequency content of said resulting signal.

7. A method for protecting a battery charging system comprising the following steps:

measuring an earth resistance in a charging device by implementing the method according to claim 6;

comparing said earth resistance value with a reference limit value of the earth resistance;

insulating the converter assembly of the charging device from the grid if said earth resistance value exceeds said reference limit value of the earth resistance.

8. The method according to claim 1, wherein said identifying value is defined by at least one parameter corresponding to an amplitude of the measuring signal.

9. A method for protecting a battery charging system comprising the following steps:

measuring an earth resistance in a charging device by implementing the method according to claim 8;

comparing said earth resistance value with a reference limit value of the earth resistance;

insulating the converter assembly of the charging device from the grid if said earth resistance value exceeds said reference limit value of the earth resistance.

10. The method according to claim 1, wherein said measuring signal has a limit average value within each current cycle; said measuring signal injection step involving modulating said value identifying the measuring signal and said pre-set duration of the measuring signal so that said value identifying the measuring signal has a maximum value compatible with said limit average value.

11. The method according to claim 10, and further comprising a grid noise analysis step including:

detecting a peak noise value within a given time interval; and modulating the value identifying the measuring signal and the pre-set duration of the measuring signal according to said peak noise value.

12. A method for protecting a battery charging system comprising the following steps:

measuring an earth resistance in a charging device by implementing the method according to claim 11;

comparing said earth resistance value with a reference limit value of the earth resistance;

insulating the converter assembly of the charging device from the grid if said earth resistance value exceeds said reference limit value of the earth resistance.

13. A method for protecting a battery charging system comprising the following steps:

measuring an earth resistance in a charging device by implementing the method according to claim 10;

comparing said earth resistance value with a reference limit value of the earth resistance;

insulating the converter assembly of the charging device from the grid if said earth resistance value exceeds said reference limit value of the earth resistance.

14. The method according to claim 1, wherein said second, earth node is, alternatively:

a physical grid node;

a reconstructed virtual node with a potential corresponding to an earth potential and in electrical continuity with the first, neutral node and phases of the grid.

15. A method for protecting a battery charging system comprising the following steps:

measuring an earth resistance in a charging device by implementing the method according to claim 14;

comparing said earth resistance value with a reference limit value of the earth resistance;

insulating the converter assembly of the charging device from the grid if said earth resistance value exceeds said reference limit value of the earth resistance.

16. A method for protecting a battery charging system comprising the following steps:

measuring an earth resistance in a charging device by implementing the method according to claim 1;

comparing said earth resistance value with a reference limit value of the earth resistance;

insulating the converter assembly of the charging device from the grid if said earth resistance value exceeds said reference limit value of the earth resistance.

* * * * *